United States Patent
Park et al.

(10) Patent No.: US 8,254,204 B2
(45) Date of Patent: Aug. 28, 2012

(54) BURST ADDRESS GENERATOR AND TEST APPARATUS INCLUDING THE SAME

(75) Inventors: Je-young Park, Yongin-si (KR);
Jae-young Choi, Hwaseong-si (KR);
Hyoung-soon Km, Hwaseong-si (KR)

(73) Assignee: Samsung Electronics Co., Ltd.,
Suwon-si, Gyeonggi-do (KR)

(*) Notice: Subject to any disclaimer, the term of this patent is extended or adjusted under 35 U.S.C. 154(b) by 237 days.

(21) Appl. No.: 12/830,667

(22) Filed: Jul. 6, 2010

(65) Prior Publication Data
US 2011/0158014 A1   Jun. 30, 2011

(30) Foreign Application Priority Data
Dec. 31, 2009   (KR) .................. 10-2009-0136220

(51) Int. Cl.
*G11C 8/04*   (2006.01)
*G11C 29/18*   (2006.01)
*G06F 9/26*   (2006.01)
*G06F 9/32*   (2006.01)
*G06F 11/00*   (2006.01)
*G01R 31/28*   (2006.01)

(52) U.S. Cl. ................. 365/239; 365/233.18; 365/201; 711/217; 711/218; 711/219; 711/220; 714/743

(58) Field of Classification Search .............. 365/201, 365/233.1, 233.18, 238.5, 239; 711/217, 711/218, 219, 220, E12.053; 714/702, 738, 714/743
See application file for complete search history.

(56) References Cited

U.S. PATENT DOCUMENTS

| | | | | |
|---|---|---|---|---|
| 5,835,969 A * | 11/1998 | Inagaki et al. | ................. | 711/217 |
| 5,854,801 A * | 12/1998 | Yamada et al. | ................. | 714/738 |
| 5,940,875 A * | 8/1999 | Inagaki et al. | ................. | 711/217 |
| 6,094,738 A * | 7/2000 | Yamada et al. | ................. | 714/738 |
| 6,205,081 B1 | 3/2001 | Lee | | |
| 6,657,636 B2 * | 12/2003 | Pether et al. | ................. | 345/562 |
| 6,813,741 B1 * | 11/2004 | Ansel et al. | ................. | 714/738 |

FOREIGN PATENT DOCUMENTS

| | | |
|---|---|---|
| JP | 2008-052770 A | 3/2008 |
| KR | 10-2000-0038777 A | 7/2000 |
| KR | 10-2004-0111202 A | 12/2004 |

* cited by examiner

*Primary Examiner* — J. H. Hur
(74) *Attorney, Agent, or Firm* — Lee & Morse, P.C.

(57) ABSTRACT

A burst address generator includes a burst bit counter for receiving at least one burst bit, and increasing or decreasing the at least one burst bit, a burst bit splitter for receiving the increased or decreased at least one burst bit from the burst bit counter, and dividing the increased or decreased at least one burst bit into an X burst bit and a Y burst bit, and a selector for receiving an X address, a Y address, the X burst bit, and the Y burst bit, and generating an X burst address based on the X address and the X burst bit and a Y burst address based on the Y address and the Y burst bit.

20 Claims, 11 Drawing Sheets

XADR = 0xX3X2X1X0 = 0x0000(2)
YADR = 0xY3Y2Y1Y0 = 0x0000(2)
BBIT = X2 X1 X0

| BL=8 | BBIT' X2' X1' X0' | | | XBADR X3 X2' X1' X0' | | | | YBADR Y3 Y2 Y1 Y0 | | | |
|---|---|---|---|---|---|---|---|---|---|---|---|
| 1 | 0 | 0 | 0 | 0 | 0 | 0 | 0 | 0 | 0 | 0 | 0 |
| 2 | 0 | 0 | 1 | 0 | 0 | 0 | 1 | 0 | 0 | 0 | 0 |
| 3 | 0 | 1 | 0 | 0 | 0 | 1 | 0 | 0 | 0 | 0 | 0 |
| 4 | 0 | 1 | 1 | 0 | 0 | 1 | 1 | 0 | 0 | 0 | 0 |
| 5 | 1 | 0 | 0 | 0 | 1 | 0 | 0 | 0 | 0 | 0 | 0 |
| 6 | 1 | 0 | 1 | 0 | 1 | 0 | 1 | 0 | 0 | 0 | 0 |
| 7 | 1 | 1 | 0 | 0 | 1 | 1 | 0 | 0 | 0 | 0 | 0 |
| 8 | 1 | 1 | 1 | 0 | 1 | 1 | 1 | 0 | 0 | 0 | 0 |

FIG. 4

|  | Y3 | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|
|  | Y2 | 0 | 0 | 0 | 0 | 1 | 1 | 1 | 1 | 0 | 0 | 0 | 0 | 1 | 1 | 1 | 1 |
|  | Y1 | 0 | 0 | 1 | 1 | 0 | 0 | 1 | 1 | 0 | 0 | 1 | 1 | 0 | 0 | 1 | 1 |
|  | Y0 | 0 | 1 | 0 | 1 | 0 | 1 | 0 | 1 | 0 | 1 | 0 | 1 | 0 | 1 | 0 | 1 |

| X3 | X2 | X1 | X0 | | | | | | | | | | | | | | | | |
|---|---|---|---|---|---|---|---|---|---|---|---|---|---|---|---|---|---|---|---|
| 0 | 0 | 0 | 0 | 1 | | | | | | | | | | | | | | | |
| 0 | 0 | 0 | 1 | 2 | | | | | | | | | | | | | | | |
| 0 | 0 | 1 | 0 | 3 | | | | | | | | | | | | | | | |
| 0 | 0 | 1 | 1 | 4 | | | | | | | | | | | | | | | |
| 0 | 1 | 0 | 0 | 5 | | | | | | | | | | | | | | | |
| 0 | 1 | 0 | 1 | 6 | | | | | | | | | | | | | | | |
| 0 | 1 | 1 | 0 | 7 | | | | | | | | | | | | | | | |
| 0 | 1 | 1 | 1 | 8 | | | | | | | | | | | | | | | |
| 1 | 0 | 0 | 0 | | | | | | | | | | | | | | | | |
| 1 | 0 | 0 | 1 | | | | | | | | | | | | | | | | |
| 1 | 0 | 1 | 0 | | | | | | | | | | | | | | | | |
| 1 | 0 | 1 | 1 | | | | | | | | | | | | | | | | |
| 1 | 1 | 0 | 0 | | | | | | | | | | | | | | | | |
| 1 | 1 | 0 | 1 | | | | | | | | | | | | | | | | |
| 1 | 1 | 1 | 0 | | | | | | | | | | | | | | | | |
| 1 | 1 | 1 | 1 | | | | | | | | | | | | | | | | |

XADR = 0xX3X2X1X0 = 0x0100 (2)
YADR = 0xY3Y2Y1Y0 = 0x1000 (2)
BBIT = X2 Y1 X0 Y3

| BL=16 | BBIT' | | | | XBADR | | | | YBADR | | | |
|---|---|---|---|---|---|---|---|---|---|---|---|---|
| | X2' | Y1' | X0' | Y3' | X3 | X2' | X1 | X0' | Y3' | Y2 | Y1' | Y0 |
| 1 | 1 | 0 | 0 | 1 | 0 | 1 | 0 | 0 | 1 | 0 | 0 | 0 |
| 2 | 1 | 0 | 1 | 0 | 0 | 1 | 0 | 1 | 0 | 0 | 0 | 0 |
| 3 | 1 | 0 | 1 | 1 | 0 | 1 | 0 | 1 | 1 | 0 | 0 | 0 |
| 4 | 1 | 1 | 0 | 0 | 0 | 1 | 0 | 0 | 0 | 0 | 1 | 0 |
| 5 | 1 | 1 | 0 | 1 | 0 | 1 | 0 | 0 | 1 | 0 | 1 | 0 |
| 6 | 1 | 1 | 1 | 0 | 0 | 1 | 0 | 1 | 0 | 0 | 1 | 0 |
| 7 | 1 | 1 | 1 | 1 | 0 | 1 | 0 | 1 | 1 | 0 | 1 | 0 |
| 8 | 0 | 0 | 0 | 0 | 0 | 0 | 0 | 0 | 0 | 0 | 0 | 0 |
| 9 | 0 | 0 | 0 | 1 | 0 | 0 | 0 | 0 | 1 | 0 | 0 | 0 |
| 10 | 0 | 0 | 1 | 0 | 0 | 0 | 0 | 1 | 0 | 0 | 0 | 0 |
| 11 | 0 | 0 | 1 | 1 | 0 | 0 | 0 | 1 | 1 | 0 | 0 | 0 |
| 12 | 0 | 1 | 0 | 0 | 0 | 0 | 0 | 0 | 0 | 0 | 1 | 0 |
| 13 | 0 | 1 | 0 | 1 | 0 | 0 | 0 | 0 | 1 | 0 | 1 | 0 |
| 14 | 0 | 1 | 1 | 0 | 0 | 0 | 0 | 1 | 0 | 0 | 1 | 0 |
| 15 | 0 | 1 | 1 | 1 | 0 | 0 | 0 | 1 | 1 | 0 | 1 | 0 |
| 16 | 1 | 0 | 0 | 0 | 0 | 1 | 0 | 0 | 0 | 0 | 0 | 0 |

FIG. 7

|  |  |  |  | Y3 | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|---|---|---|
|  |  |  |  | Y2 | 0 | 0 | 0 | 0 | 1 | 1 | 1 | 1 | 0 | 0 | 0 | 0 | 1 | 1 | 1 | 1 |
|  |  |  |  | Y1 | 0 | 0 | 1 | 1 | 0 | 0 | 1 | 1 | 0 | 0 | 1 | 1 | 0 | 0 | 1 | 1 |
|  |  |  |  | Y0 | 0 | 1 | 0 | 1 | 0 | 1 | 0 | 1 | 0 | 1 | 0 | 1 | 0 | 1 | 0 | 1 |
| X3 | X2 | X1 | X0 |  |  |  |  |  |  |  |  |  |  |  |  |  |  |  |  |  |
| 0 | 0 | 0 | 0 |  | 8 |  | 12 |  |  |  |  |  | 9 |  | 13 |  |  |  |  |  |
| 0 | 0 | 0 | 1 |  | 10 |  | 14 |  |  |  |  |  | 11 |  | 15 |  |  |  |  |  |
| 0 | 0 | 1 | 0 |  |  |  |  |  |  |  |  |  |  |  |  |  |  |  |  |  |
| 0 | 0 | 1 | 1 |  |  |  |  |  |  |  |  |  |  |  |  |  |  |  |  |  |
| 0 | 1 | 0 | 0 |  | 16 |  | 4 |  |  |  |  |  | 1 |  | 5 |  |  |  |  |  |
| 0 | 1 | 0 | 1 |  | 2 |  | 6 |  |  |  |  |  | 3 |  | 7 |  |  |  |  |  |
| 0 | 1 | 1 | 0 |  |  |  |  |  |  |  |  |  |  |  |  |  |  |  |  |  |
| 0 | 1 | 1 | 1 |  |  |  |  |  |  |  |  |  |  |  |  |  |  |  |  |  |
| 1 | 0 | 0 | 0 |  |  |  |  |  |  |  |  |  |  |  |  |  |  |  |  |  |
| 1 | 0 | 0 | 1 |  |  |  |  |  |  |  |  |  |  |  |  |  |  |  |  |  |
| 1 | 0 | 1 | 0 |  |  |  |  |  |  |  |  |  |  |  |  |  |  |  |  |  |
| 1 | 0 | 1 | 1 |  |  |  |  |  |  |  |  |  |  |  |  |  |  |  |  |  |
| 1 | 1 | 0 | 0 |  |  |  |  |  |  |  |  |  |  |  |  |  |  |  |  |  |
| 1 | 1 | 0 | 1 |  |  |  |  |  |  |  |  |  |  |  |  |  |  |  |  |  |
| 1 | 1 | 1 | 0 |  |  |  |  |  |  |  |  |  |  |  |  |  |  |  |  |  |
| 1 | 1 | 1 | 1 |  |  |  |  |  |  |  |  |  |  |  |  |  |  |  |  |  |

BURST ADDRESS GENERATOR AND TEST APPARATUS INCLUDING THE SAME

BACKGROUND

1. Field

Embodiments relate to a burst address generator and a test apparatus including the same.

2. Description of the Related Art

During a process of manufacturing a memory device, a memory component manufactured via a predetermined process is tested to check whether the memory component normally performs a data writing and reading function. A testing apparatus generates a logic signal, such as a command, an address, or a data signal, and tests a device under test (DUT) by applying the logic signal on the DUT.

SUMMARY

It is a feature of an embodiment to provide a burst address generator for generating various types of burst address.

It is another feature of an embodiment to provide a test apparatus for testing data of a device under test (DUT) stored in a burst address generated by the burst address generator.

At least one of the above and other features and advantages may be realized by providing a burst address generator, including a burst bit counter for receiving at least one burst bit, and increasing or decreasing the at least one burst bit, a burst bit splitter for receiving the increased or decreased at least one burst bit from the burst bit counter, and dividing the increased or decreased at least one burst bit into an X burst bit and a Y burst bit, and a selector for receiving an X address, a Y address, the X burst bit, and the Y burst bit, and generating an X burst address based on the X address and the X burst bit and a Y burst address based on the Y address and the Y burst bit.

The at least one burst bit may include a plurality of burst bits, and the burst bit counter may receive the plurality of burst bits, and may increase or decrease the plurality of burst bits sequentially from the least significant bit.

The X burst address may include at least one X constant bit and at least one X variable bit, the selector may generate the X constant bit from the X address and the X variable bit from the X burst bit so as to generate the X burst address, the Y burst address may include at least one Y constant bit and at least one Y variable bit, and the selector may generate the Y constant bit from the Y address and the Y variable bit from the Y burst bit so as to generate the Y burst address.

The burst address generator may further include an algorithm pattern generator configured to generate the X and Y addresses, and a burst bit generator configured to determine the at least one burst bit of the X and Y addresses.

The burst bit generator may determine the at least one burst bit according to information received from an input unit.

The burst address generator may operate in synchronization with a rising edge of a reference clock.

The burst address generator may operate in synchronization with a rising edge and a falling edge of a reference clock.

At least one of the above and other features and advantages may also be realized by providing a burst address generator, including a controller configured to determine an X address, a Y address, at least one burst bit of the X address and Y address, a burst bit counter for receiving the at least one burst bit, and increasing or decreasing the at least one burst bit, a burst bit splitter for receiving the increased or decreased at least one burst bit from the burst bit counter, and dividing the increased or decreased at least one burst bit into an X burst bit and a Y burst bit, a first selector for receiving the X address and the X burst bit, and generating an X burst address, and a second selector for receiving the Y address and the Y burst bit, and generating a Y burst address.

The at least one burst bit may include a plurality of burst bits, and the burst bit counter may receive the plurality of burst bits, and increase or decrease the plurality of burst bits sequentially from the least significant bit.

The X burst address may include at least one X constant bit and at least one X variable bit, and the first selector may generate the X constant bit from the X address and the X variable bit from the X burst bit so as to generate the X burst address.

The Y burst address may include at least one Y constant bit and at least one Y variable bit, and the second selector may generate the Y constant bit from the Y address and the Y variable bit from the Y burst bit so as to generate the Y burst address.

The controller may include an algorithm pattern generator configured to generate the X address and the Y address, and a burst bit generator configured to determine the at least one burst bit of the X address and the Y address.

The burst bit generator may determine the at least one burst bit according to information received from an input unit.

The burst address generator may operate in synchronization with a rising edge of a reference clock.

The burst address generator may operate in synchronization with a rising edge and a falling edge of a reference clock.

At least one of the above and other features and advantages may be realized by providing a test apparatus, including a burst address generator, the burst address generator including a controller configured to determine an X address, a Y address, at least one burst bit of the X address and Y address, a burst bit counter for receiving the at least one burst bit, and increasing or decreasing the at least one burst bit, a burst bit splitter for receiving the increased or decreased at least one burst bit from the burst bit counter, and dividing the increased or decreased at least one burst bit into an X burst bit and a Y burst bit, a first selector for receiving the X address and the X burst bit, and generating an X burst address, and a second selector for receiving a Y address and a Y burst bit, and generating a Y burst address.

The at least one burst bit may include a plurality of burst bits, and the burst bit counter may receive the plurality of burst bits, and increase or decrease the plurality of burst bits sequentially from the least significant bit.

The test apparatus may further include a test head that includes a probe pin connectable to a device under test, and a comparator. The device under test may receive the X burst address and the Y burst address through the probe pin, and output data stored in the X burst address and the Y burst address, and the comparator may generate a comparison result by comparing the data output from the device under test and expected data.

The test apparatus may further include a failure capture memory. The failure capture memory may receive the X burst address and the Y burst address, and store the comparison result in the X burst address and the Y burst address.

The expected data may data stored in the X burst address and the Y burst address of a good memory.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2009-0136220, filed on Dec. 31, 2009, in the Korean Intellectual Property Office, and entitled: "Burst Address Generator and Test Apparatus Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

Terms used herein are used to describe embodiments, and are not used to limit the scope of the invention. Unless otherwise defined, a singular form may include a plural form. The terms "comprise" and/or "comprising" specify existence of a mentioned shapes, numbers, steps, operations, members, elements, and/or groups thereof, but do not exclude existence or addition of at least one other shape, number, step, operation, member, element, and/or group thereof. As used herein, the term "and/or" includes any and all combinations of one or more of the associated listed items.

The terms "first," "second," and the like are used to describe various members, areas, and/or regions, but do not limit such members, parts, areas, layers and/or regions. These terms do not mean a certain order, top or bottom, or priority, and are used only to classify one member, area, or region from another member, area, or region. Accordingly, a first member, area, or region may denote a second member, area, or region without deviating from the teachings of the embodiments.

In the drawings, illustrated shapes may change according to, for example, manufacturing technology and/or tolerance. Accordingly, the embodiments are not limited to the illustrated shapes, and include change in shapes that may occur during manufacture.

The term "burst" denotes sequential increase or sequential decrease. Accordingly, a burst bit means that a certain bit sequentially increases or sequentially decreases, and a burst address means that a certain address sequentially increases or sequentially decreases. Data may be read or written by sequentially increasing or decreasing an address by using a burst address. Here, a large amount of data stored in continuous addresses, i.e., sequential addresses, may be stored or output quickly as the data is synchronized with a clock signal.

Figure 1:
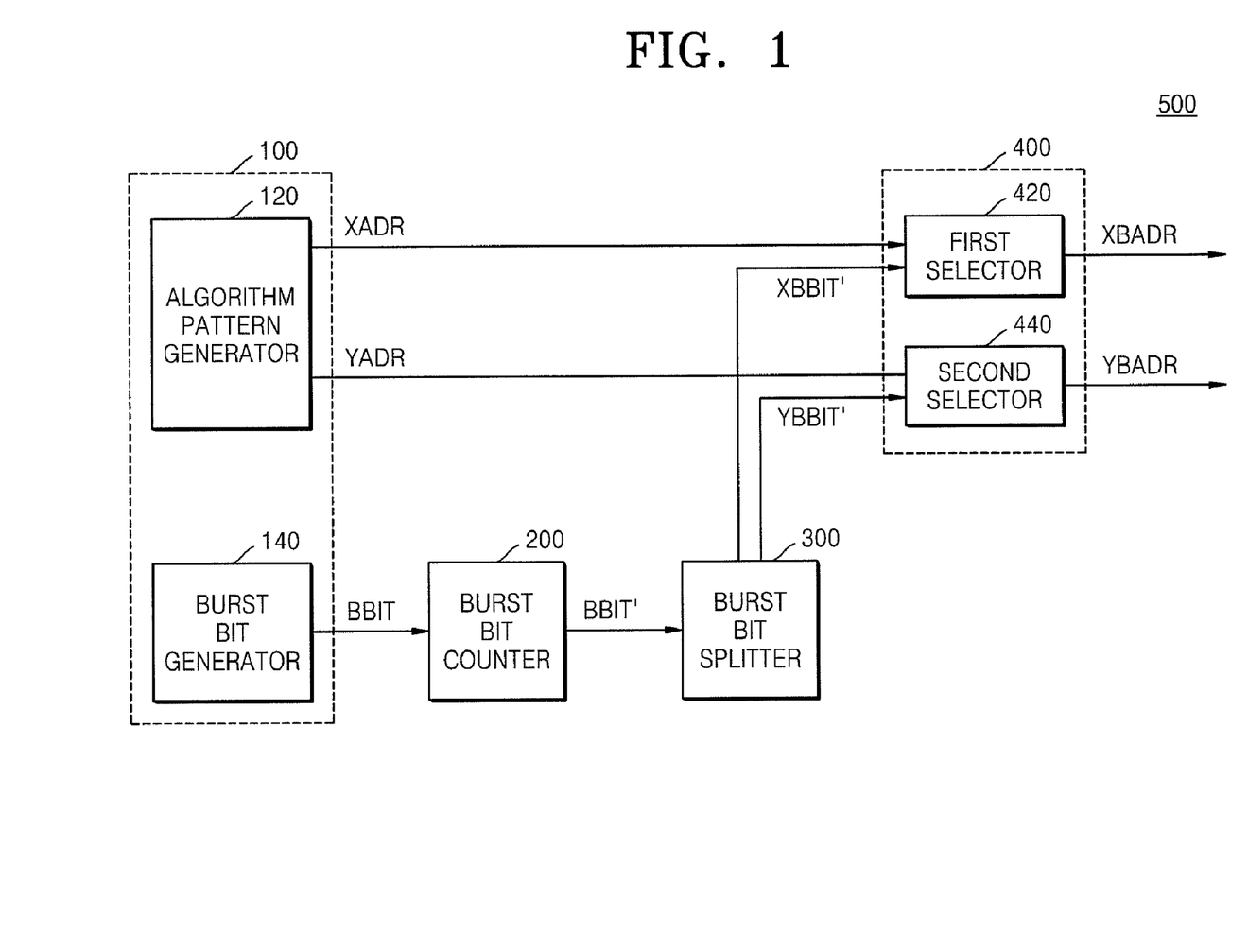
FIG. 1 illustrates a block diagram schematically showing a burst address generator according to an embodiment.

FIG. 1 illustrates a block diagram schematically showing a burst address generator according to an embodiment.

Referring to FIG. 1, the burst address generator 500 may include a controller 100, a burst bit counter 200, a burst bit splitter 300, and a selector 400.

The controller 100 may be configured to determine an X address XADR, a Y address YADR, and at least one burst bit BBIT of the X and Y addresses XADR and YADR.

The controller 100 may include an algorithm pattern generator (ALPG) 120 and a burst bit generator 140. The ALPG 120 may be configured to generate the X and Y addresses XADR and YADR. The burst bit generator 140 may be configured to determine the at least one burst bit BBIT of the X and Y addresses XADR and YADR. The burst bit generator may determine the burst bit BBIT according to information received through an input unit, such as a keyboard or a mouse.

The burst bit counter 200 may receive the burst bit BBIT and increase or decrease the burst bit BBIT. An initial value of the burst bit BBIT to be increased or decreased may correspond to a value of a corresponding digit number corresponding to the X and Y addresses XADR and YADR. The at least one burst bit BBIT may have a plurality of burst bits BBIT. In this case, the burst bit counter 200 receives the plurality of burst bits BBIT, and may increase or decrease the plurality of burst bits BBIT sequentially from the least significant bit (LSB) of the plurality of burst bits BBIT.

The burst bit splitter 300 may receive the increased or decreased burst bit BBIT' from the burst bit counter 200, divide the increased or decreased burst bit BBIT' into an X burst bit XBBIT' and a Y burst bit YBBIT', and transmit the result to the selector 400. For example, the burst bit splitter 300 may transmit the X burst bit XBBIT' to a first selector 420 and the Y burst bit YBBIT' to a second selector 440.

The selector 400 may receive the X address XADR, the Y address YADR, the X burst bit XBBIT', and the Y burst bit YBBIT', and generate an X burst address XBADR and a Y burst address YBADR. The selector 400 may include the first selector 420 and the second selector 440. The first selector 420 may receive the X address XADR and the X burst bit XBBIT', and generate the X burst address XBADR. The second selector 440 may receive the Y address YADR and the Y burst bit YBBIT', and generate the Y burst address YBADR.

The X burst address XBADR may include at least one X constant bit and at least one X variable bit, and the Y burst address YBADR may include at least one Y constant bit and at least one Y variable bit. To generate the X burst address XBADR, the first selector 420 may generate the X constant bit from the X address XADR, and generate the X variable bit from the X burst bit XBBIT'. To generate the Y burst address YBADR, the second selector 440 may generate the Y constant bit from the Y address YADR, and generate the Y variable bit from the Y burst bit YBBIT'.

The burst address generator 500 may be operated by being synchronized with a rising edge of a reference clock. Thus, the burst address generator 500 may generate a burst address of a synchronous dynamic random access memory (SDRAM). In another implementation, the burst address generator 500 may be operated by being synchronized with a rising edge and a falling edge of a reference clock. This, the burst address generator 500 may generate a burst address of a double data rate synchronous dynamic random access memory DDR-SDRAM.

Figure 2:
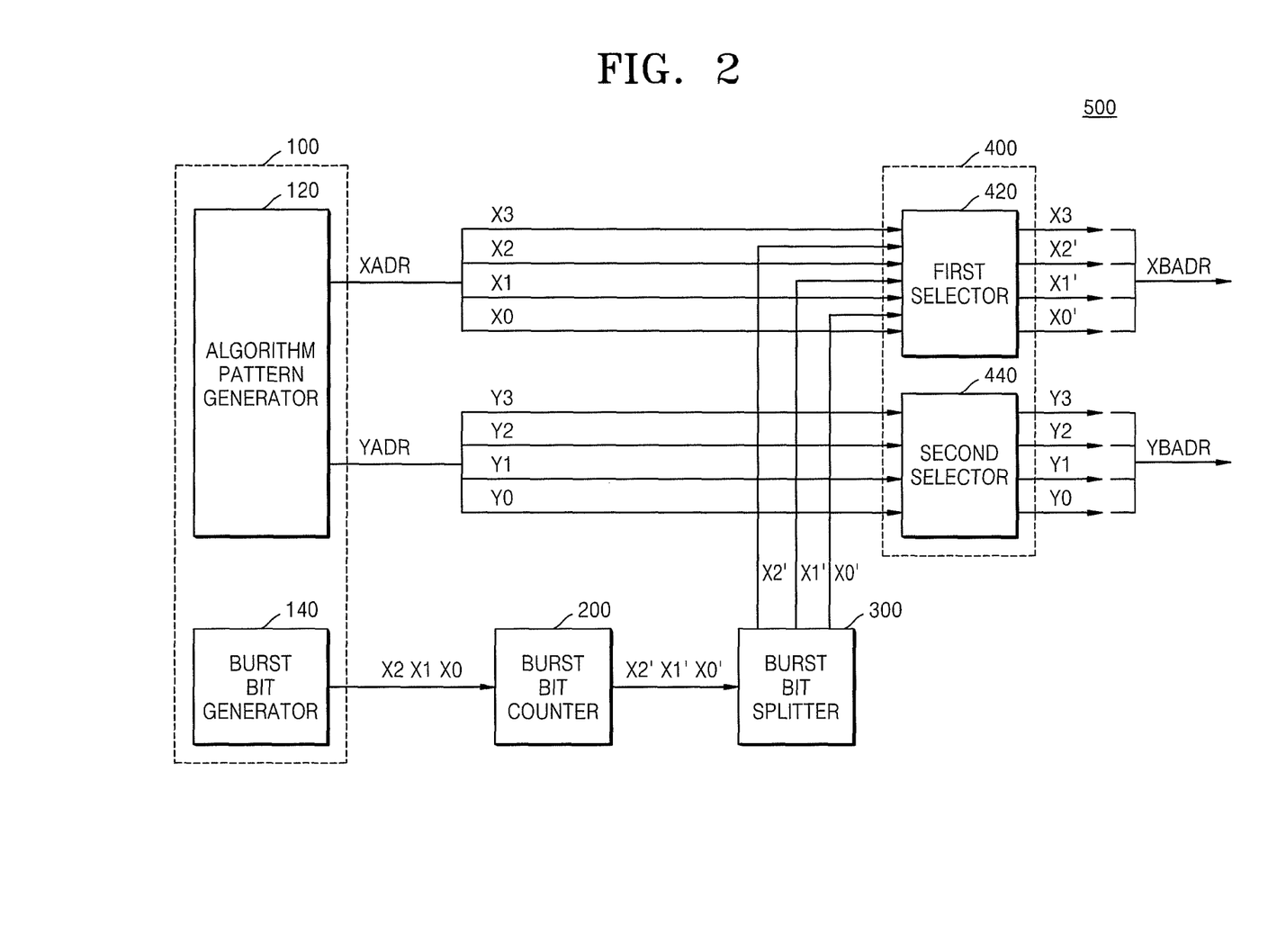
FIG. 2 illustrates a block diagram schematically showing a burst address generator according to another embodiment.
Figure 3:
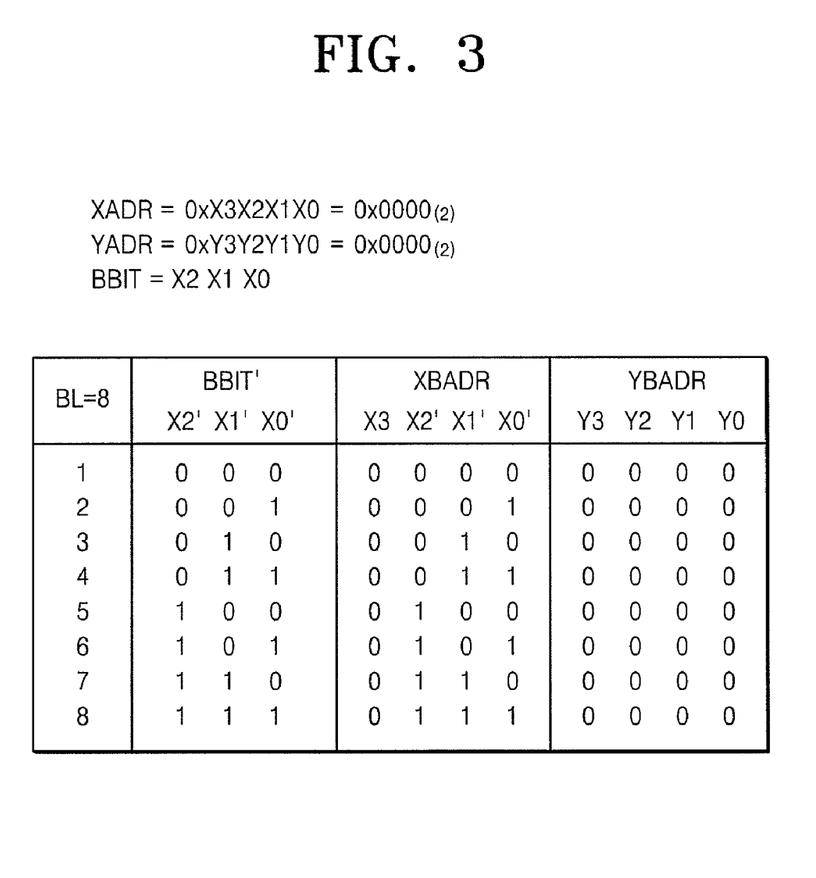
FIG. 3 illustrates a table of X and Y burst addresses generated by the burst address generator of FIG. 2.
Figure 4:
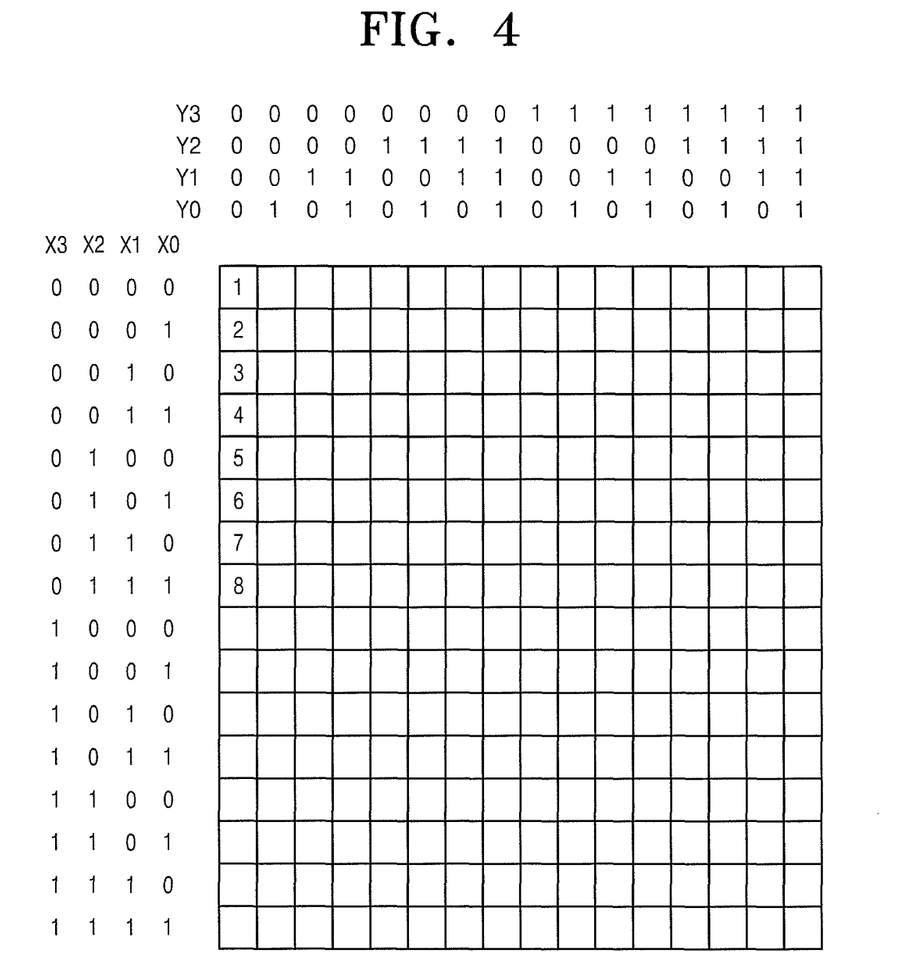
FIG. 4 illustrates a diagram of an address of a memory cell for reading and writing data according to the X and Y burst addresses of FIG. 3.

FIG. 2 illustrates a block diagram schematically showing a burst address generator 500 according to another embodiment, FIG. 3 illustrates a table of X and Y burst addresses XBADR and YBADR generated by the burst address generator 500 of FIG. 2, and FIG. 4 illustrates a diagram of an address of a memory cell for reading and writing data according to the X and Y burst addresses XBADR and YBADR of FIG. 3.

Referring to FIGS. 2 through 4, the ALPG 120 may generate an X address XADR (X3, X2, X1, X0) and a Y address YADR (Y3, Y2, Y1, Y0), each formed of a 4-digit number binary address. For example, the ALPG 120 may generate an X address XADR (0x0000) formed of a binary address, wherein X3=0, X2=0, X1=0, and X0=0, and a Y address YADR (0x0000) formed of a binary address, wherein Y3=0, Y2=0, Y1=0, and Y0=0. The burst bit generator 140 may determine burst bits BBIT (X2, X1, X0) through an input unit, such as a keyboard or a mouse.

The burst bit counter 200 may increase the burst bits BBIT from a least significant bit (LSB). Since initial values of the burst bits BBIT to be increased by the burst bit counter 200 correspond to values of corresponding digit-number of the X address XADR and Y address YADR, the initial values of the burst bits BBIT are X2=0, X1=0, and X0=0. When a burst length BL is 8, the burst bit counter 200 may increase the initial values (X2=0, X1=0, X0=0) by 8 times, such as 000, 001, 010, 011, 100, 101, 110, and 111, from the LSB.

The burst bit splitter 300 receives the increased burst bits BBIT' (X2', X1', X0'), i.e., 000, 001, 010, 011, 100, 101, 100, and 111, from the burst bit counter 200. Since all of the increased burst bits BBIT' are X burst bits XBBIT', the burst bit splitter 300 transmits all of the increased burst bits BBIT' to the first selector 420.

The first selector 420 may receive the X address XADR and the X burst bits, and generate the X burst address XBADR (X3, X2', X1', X0'). For example, the X burst address XBADR may include an X constant bit (X3) and X variable bits (X2', X1', X0'). Accordingly, the first selector 420 may generate the X constant bit from the X address XADR, and the X variable bits from the X burst bit XBBIT', so as to generate the X burst address XBADR.

The X variable bits constituting the increased burst bits BBIT' (X3', X2', X1') are continuously increased, i.e., sequentially increased, by the burst bit counter 200. Accordingly, the X burst addresses XBADR continuously generated, i.e., sequentially generated, by the burst address generator 500 may be 0x0000, 0x0001, 0x0010, 0x0011, 0x0100, 0x0101, 0x0110, and 0x0111. The Y burst address YBADR (Y3, Y2, Y1, Y0) may be fixed to 0x0000. Referring to locations (1) to (8) in the diagram illustrated in FIG. 4, when the X burst addresses XBADR (that are continuously generated) and the Y burst address YBADR (that is fixed) are shown as [XBADR, YBADR] for an address of a memory cell, the addresses may be [0x0000, 0x0000] as in (1), [0x0001, 0x0000] as in (2), [0x0010, 0x0000] as in (3), [0x0011, 0x0000] as in (4), [0x0100, 0x0000] as in (5), [0x0101, 0x0000] as in (6), [0x0110, 0x0000] as in (7), and [0x0111, 0x0000] as in (8).

A general burst address generator generates a burst address in one row. In contrast, the burst address generator 500 according to the present embodiment also generates a burst address in one column. Accordingly, not only the Y burst address YBADR, but also the X burst address XBADR may be generated. Thus, various types of burst address may be generated.

Figure 5:
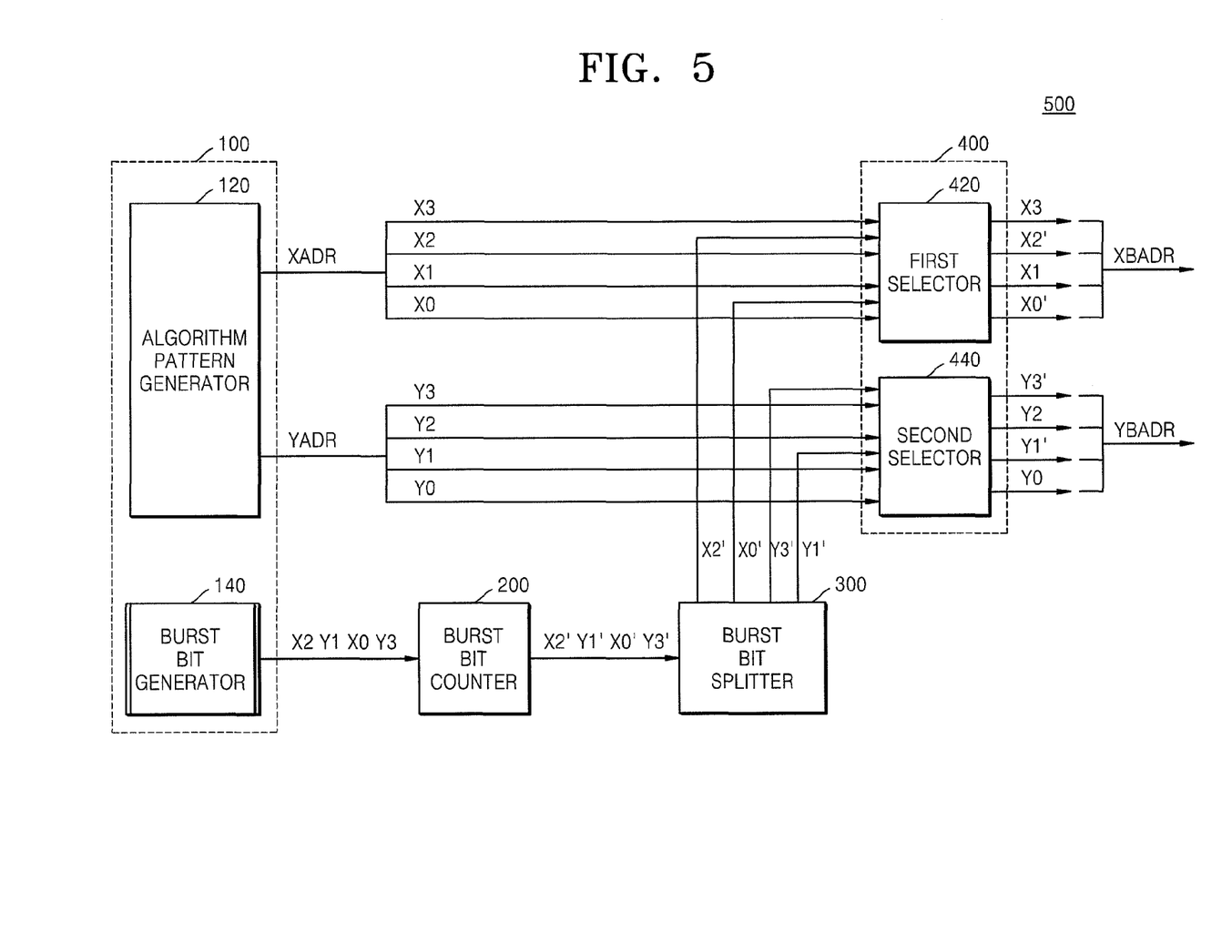
FIG. 5 illustrates a block diagram schematically showing a burst address generator according to another embodiment.
Figure 6:
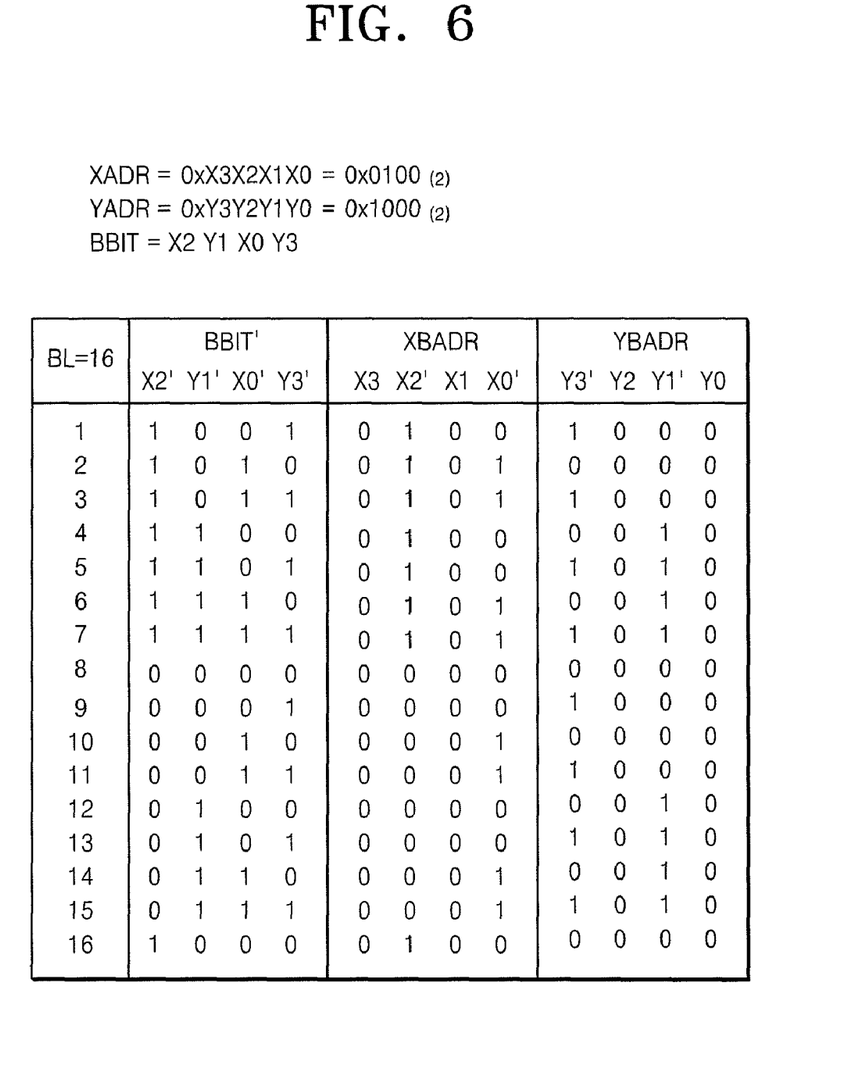
FIG. 6 illustrates a table of X and Y burst addresses generated by the burst address generator of FIG. 5.
Figure 7:
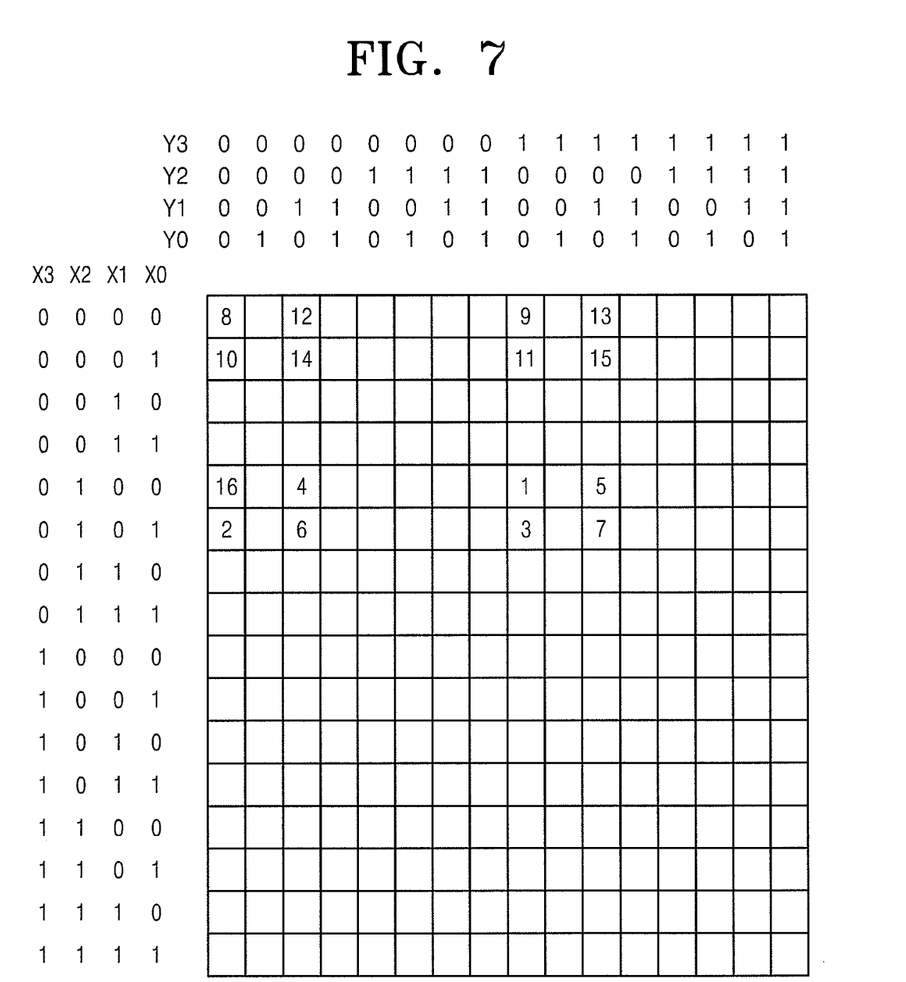
FIG. 7 illustrates a diagram of an address of a memory cell for reading and writing data according to the X and Y burst addresses of FIG. 6.

FIG. 5 illustrates a block diagram schematically showing a burst address generator 500 according to another embodiment, FIG. 6 illustrates a table of X and Y burst addresses XBADR and YBADR generated by the burst address generator 500 of FIG. 5, and FIG. 7 illustrates a diagram of an address of a memory cell for reading and writing data according to the X and Y burst addresses XBADR and YBADR of FIG. 6.

Referring to FIGS. 5 through 7, the ALPG 120 may generate an X address XADR (X3, X2, X1, X0) and a Y address YADR (Y3, Y2, Y1, Y0), each formed of a 4-digit number binary address. For example, the ALPG 120 may generate an X address XADR (0x0100) formed of a binary address, wherein X3=0, X2=1, X1=0, and X0=0, and a Y address YADR (0x1000) formed of a binary address, wherein Y3=1, Y2=0, Y1=0, and Y0=0. The burst bit generator 140 may determine burst bits BBIT (X2, Y1, X0, Y3) through an input unit, such as a keyboard or a mouse.

The burst bit counter 200 may increase the burst bits BBIT from a LSB. Since initial values of the burst bits BBIT to be increased by the burst bit counter 200 correspond to values of corresponding digit-number of the X address XADR and Y address YADR, the initial values of the burst bits BBIT are X2=1, Y1=0, X0=0, and Y3=1. When a burst length BL is 16, the burst bit counter 200 may increase the initial values (X2=1, Y1=0, X0=0, Y3=1) by 16 times, such as 1001, 1010, 1011 to 0111, 1000, from the LSB.

The burst bit splitter 300 receives the increased burst bits BBIT' (X2', Y1', X0', Y3'), i.e., 1001 through 1000, from the burst bit counter 200. The burst bit splitter 300 divides the increased burst bit BBIT' into X burst bits XBBIT' (X2', X0') and Y burst bits YBBIT' (Y1', Y3'). The burst bit splitter 300 transmits the X burst bits XBBIT' to the first elector 420 and the Y burst bits YBBIT' to the second selector 440.

The first selector 420 may receive the X address XADR and the X burst bits XBBIT', and generate the X burst address XBADR (X3, X2', X1, X0'). For example, the X burst address XBADR may include X constant bits (X3, X1), and X variable bits (X2', X0'). Accordingly, the first selector 420 generates the X constant bits (X3, X1) from the X address XADR (X3, X2, X1, X1), and the X variable bits (X2', X0') from the X burst bits XBBIT' (X2', X0'), so as to generate the X burst address XBADR.

Meanwhile, the second selector 440 may receive the Y address YADR and the Y burst bits YBBIT', and generate the Y burst address YBADR (Y3', Y2, Y1', Y0). For example, the Y burst address YBADR may include Y constant bits (Y2, Y0) and Y variable bits (Y3', Y1). Accordingly, the second selector 440 may generate the Y constant bits (Y2, Y0) from the Y address YADR (Y3, Y2, Y1, Y0), and the Y variable bits (Y3', Y1') from the Y burst bits YBBIT' (Y3', Y1'), so as to generate the Y burst address YBADR.

The X variable bits and the Y variable bits constituting the increased burst bits BBIT' are continuously increased by the burst bit counter 200. Accordingly, the X burst addresses XBADR continuously generated by the burst address generator 500 are 0x0100, 0x0101, 0x0101 to 0x0001, and 0x0100. Also, the Y burst addresses YBADR continuously generated by the burst address generator 500 are 0x1000, 0x0000, 0x1000 to 0x1010, and 0x0000. Referring to locations (1) to (16) in the diagram illustrated in FIG. 7, when the X burst addresses XBADR and the Y burst addresses YBADR, which are continuously generated, are shown as [XBADR, YBADR] as an address of a memory cell, the addresses may be

[0x0100, 0x1000] as in (1), [0x0101, 0x0000] as in (2), [0x0101, 0x1000] as in (3) to [0x0001, 0x1010] as in (15), and [0x0100, 0x0000] as in (16).

Accordingly, the burst address generator 500 according to the present embodiment may generate a burst address without being limited to a row or a column. Thus, various types of burst address may be generated when the burst address generator 500 combines the X address XADR, the Y address YADR, the X burst bit XBBIT', and the Y burst bit YBBIT'.

Figure 8:
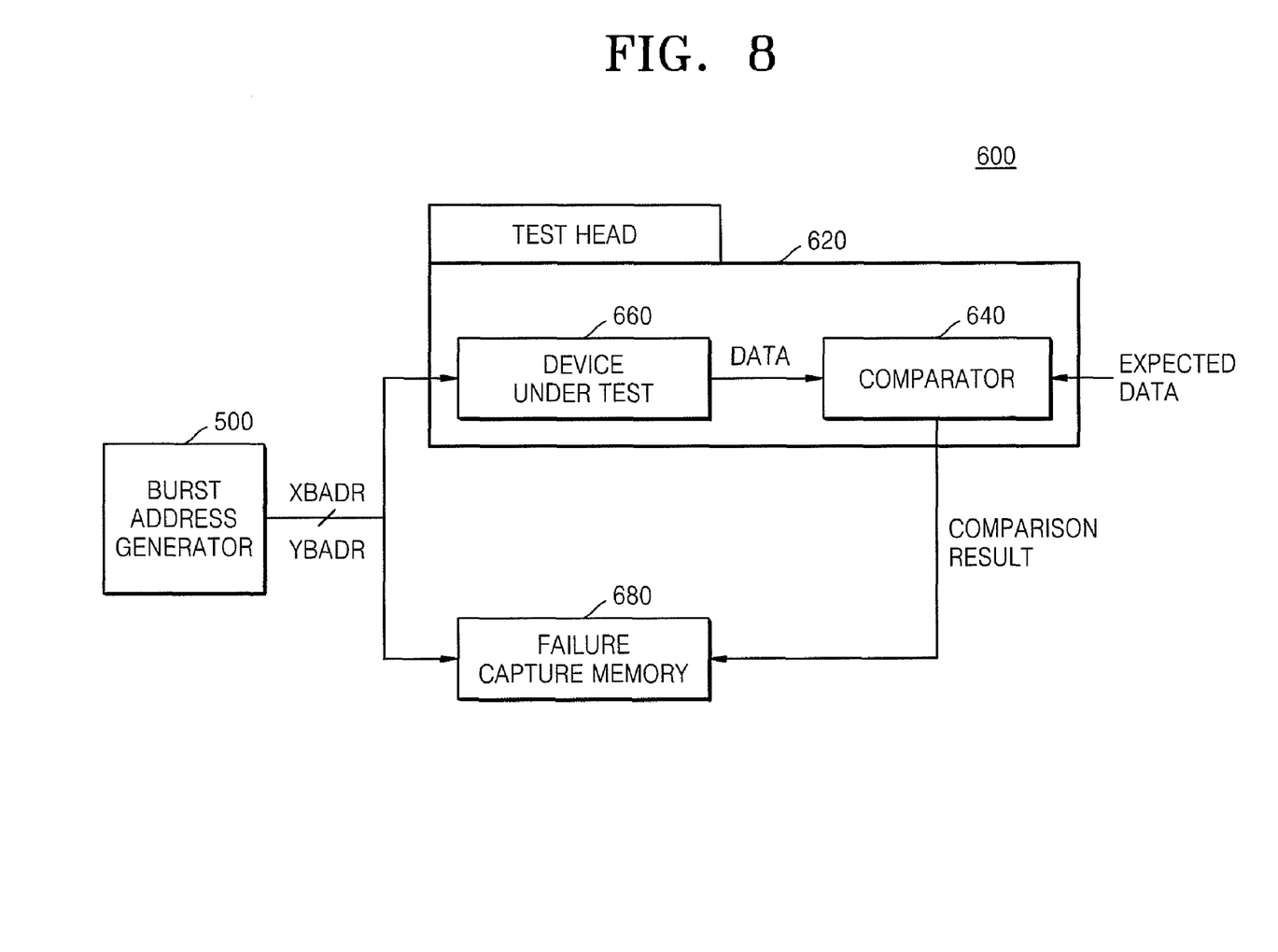
FIG. 8 illustrates a block diagram schematically showing a test apparatus according to an embodiment.
Figure 9:
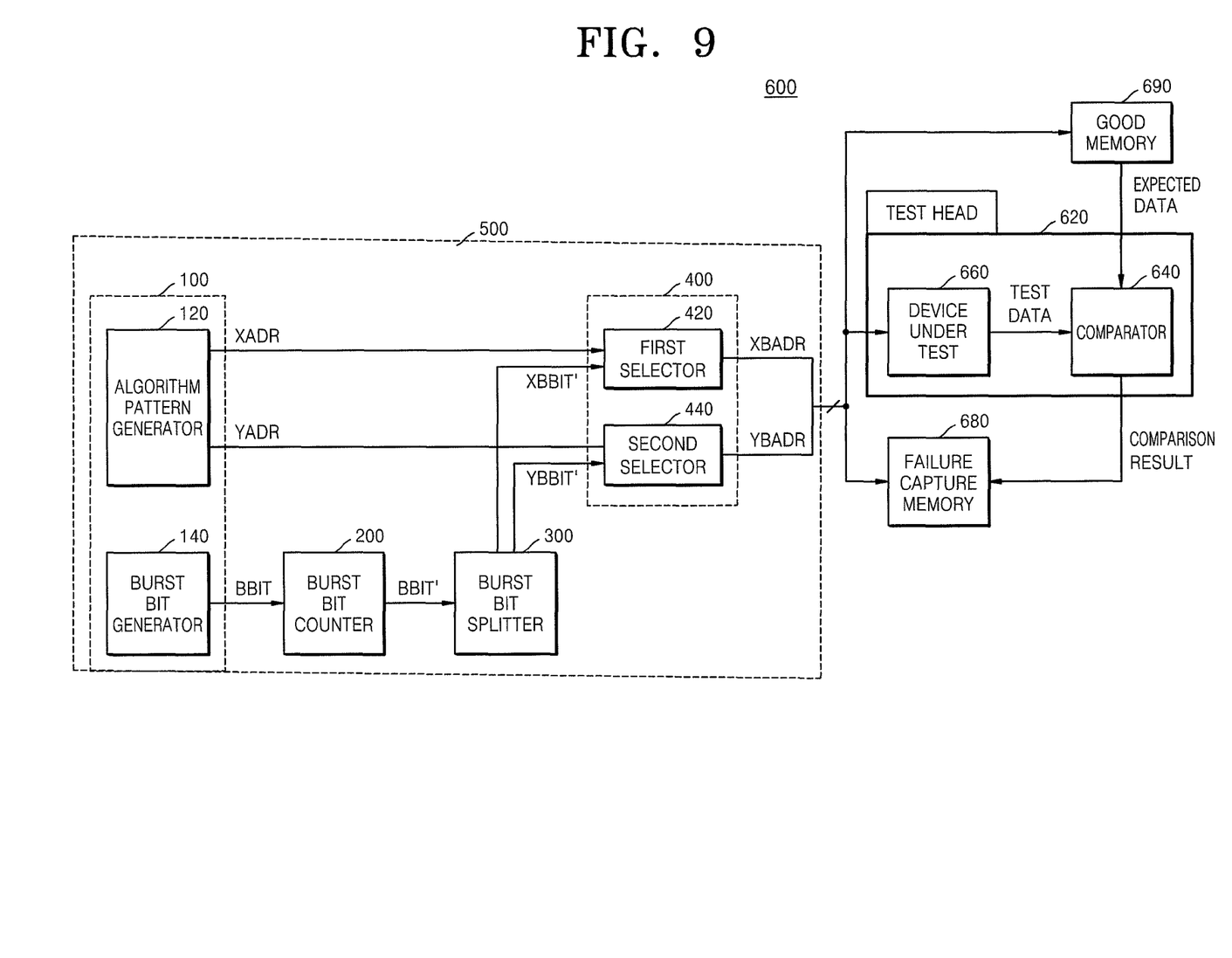
FIG. 9 illustrates a block diagram showing details of the test apparatus of FIG. 8.

FIG. 8 illustrates a block diagram schematically showing a test apparatus 600 according to an embodiment, and FIG. 9 illustrates a block diagram showing details of the test apparatus 600 of FIG. 8.

Referring to FIGS. 8 and 9, the test apparatus 600 may include the burst address generator 500. As described above, the burst address generator 500 may include the controller 100 including the ALPG 120 and the burst bit generator 140, the burst bit counter 200, the burst bit splitter 300, and the selector 400, which may include the first selector 420 and the second selector 440. The test apparatus 600 may further include a probe pin (not shown), a test head 620 including a comparator 640, and a failure capture memory (FCM) 680.

The probe pin may be connected to a device under test (DUT) 660, and may transmit the X burst address XBADR and the Y burst address YBADR generated by the burst address generator 500 to the DUT 660.

The DUT 660 may receive the X burst address XBADR and the Y burst address YBADR through the probe pin, and output data stored in the X burst address XBADR and the Y burst address YBADR.

The comparator 640 may generate a comparison result by comparing the data output from the DUT 660 with expected data. The expected data may be data stored in a good memory 690 (see FIG. 9). For example, the expected data may be data stored in X and Y burst addresses XBADR and YBADR of the good memory 690.

The FCM 680 may receive the X and Y burst addresses XBADR and YBADR from the burst address generator 500, and may receive the comparison result from the comparator 640. The FCM 680 may store the comparison result in the X and Y burst addresses XBADR and YBADR of the FCM 680.

For example, the comparator 640 may output 1 when the data output from the DUT 660 and the expected data are identical. The comparator 640 may output 0 when the data output from the DUT 660 and the expected data are not identical. The FCM 680 may store 0 or 1, which is the comparison result, according to the X and Y burst addresses XBADR and YBADR. By checking the address(es) of data that is 0 from among the data stored in the FCM 680, address(es) of the DUT 660 having a defect may be determined.

Figure 10:
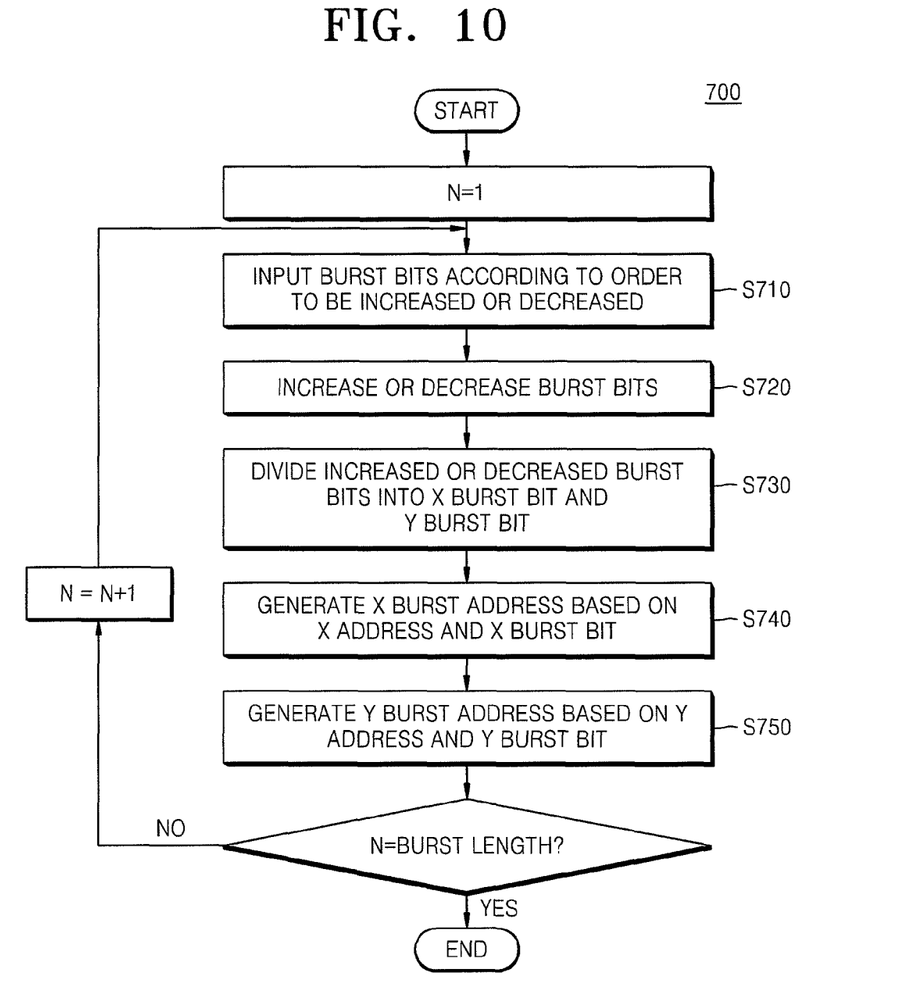
FIG. 10 illustrates a flowchart of a method of generating a burst address, according to an embodiment.

FIG. 10 illustrates a flowchart of a method of generating a burst address, according to an embodiment.

Referring to FIG. 10, burst bits are input according to an order to be increased or decreased in operation S710, in order to generate a burst address. As described above, the burst bits may be input through an input unit, such as a keyboard or a mouse. In operation S720, the burst bits are increased or decreased. As described above, the burst bits are increased or decreased by a burst bit counter, and from a LSB.

In operation S730, the increased or decreased burst bits are divided into an X burst bit and a Y burst bit. As described above, the increased or decreased burst bits may be divided by a burst bit splitter, wherein the X burst bit may be transmitted to a first selector, and the Y burst bit may be transmitted to a second selector.

In operation S740, an X burst address is generated based on the X burst bit and an X address, and, in operation S750, a Y burst address is generated based on the Y burst bit and a Y address.

Operations S710 through S750 may be repeated by a burst length. For example, when the burst length is 8, operations S710 through S750 are performed 8 times, so as to generate 8 continuous X burst addresses and 8 continuous Y burst addresses.

Figure 11:
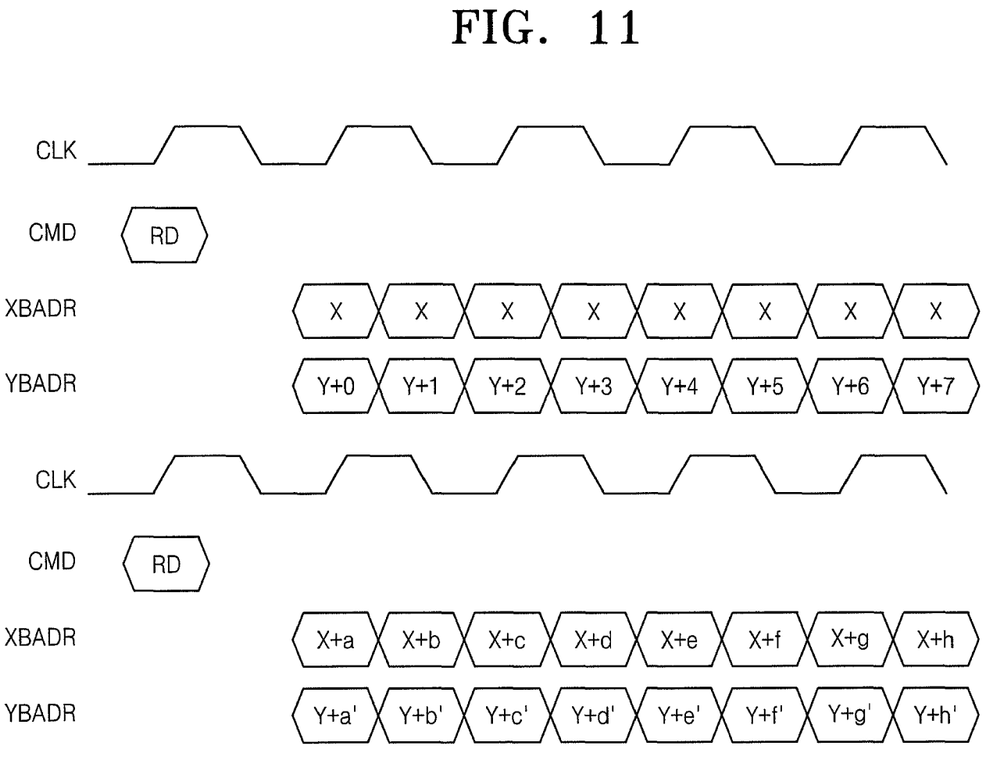
FIG. 11 illustrates a timing diagram comparing a burst address generated by a comparative burst address generator and a burst address generated by the burst address generator according to an embodiment.

FIG. 11 illustrates a timing diagram comparing a burst address generated by a comparative burst address generator (top) and a burst address generated by the burst address generator according to an embodiment (bottom).

Referring to FIG. 11 (top), the comparative burst address generator only generates a Y burst address YBADR by calculating only an LSB of a Y address. For example, when a burst length is 8 and an operation signal RD is input, the comparative burst address generator generates a constant X address X and the Y burst address YBADR (Y+0 through Y+7) sequentially generating from the LSB. Accordingly, the comparative burst address generator generates a burst address in only one row.

In contrast, referring to FIG. 11 (bottom), the burst address generator 500 generates a burst address regardless of a row and column. For example, when a burst length is 8 and an operation signal RD is input, the burst address generator 500 may generate an X burst address XBADR (X+a through X+h) and a Y burst address YBADR (Y+a' through Y+h') by combining an X address, a Y address, X burst bits, and Y burst bits. Thus, various types of burst address can be generated.

The burst address generator 500 may be included in the test apparatus 600. Further, the burst address generator 500 may be included in a driving circuit of a DRAM. Here, the burst address generator 500 may be configured to assign an address of the DRAM.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A burst address generator, comprising:
   a burst bit counter for receiving at least one burst bit, and increasing or decreasing the at least one burst bit;
   a burst bit splitter for receiving the increased or decreased at least one burst bit from the burst bit counter, and dividing the increased or decreased at least one burst bit into an X burst bit and a Y burst bit; and
   a selector for receiving an X address, a Y address, the X burst bit, and the Y burst bit, and generating an X burst address based on the X address and the X burst bit and a Y burst address based on the Y address and the Y burst bit.

2. The burst address generator as claimed in claim 1, wherein:
   the at least one burst bit includes a plurality of burst bits, and
   the burst bit counter receives the plurality of burst bits, and increases or decreases the plurality of burst bits sequentially from the least significant bit.

3. The burst address generator as claimed in claim 1, wherein:
   the X burst address includes at least one X constant bit and at least one X variable bit, the selector generates the X constant bit from the X address and the X variable bit from the X burst bit so as to generate the X burst address, the Y burst address includes at least one Y constant bit and at least one Y variable bit, and the selector generates the Y constant bit from the Y address and the Y variable bit from the Y burst bit so as to generate the Y burst address.

4. The burst address generator as claimed in claim 1, further comprising:

an algorithm pattern generator configured to generate the X and Y addresses; and a burst bit generator configured to determine the at least one burst bit of the X and Y addresses.

5. The burst address generator as claimed in claim 4, wherein the burst bit generator determines the at least one burst bit according to information received from an input unit.

6. The burst address generator as claimed in claim 1, wherein the burst address generator operates in synchronization with a rising edge of a reference clock.

7. The burst address generator as claimed in claim 1, wherein the burst address generator operates in synchronization with a rising edge and a falling edge of a reference clock.

8. A burst address generator, comprising:

a controller configured to determine an X address, a Y address, at least one burst bit of the X address and Y address;

a burst bit counter for receiving the at least one burst bit, and increasing or decreasing the at least one burst bit;

a burst bit splitter for receiving the increased or decreased at least one burst bit from the burst bit counter, and dividing the increased or decreased at least one burst bit into an X burst bit and a Y burst bit;

a first selector for receiving the X address and the X burst bit, and generating an X burst address; and a second selector for receiving the Y address and the Y burst bit, and generating a Y burst address.

9. The burst address generator as claimed in claim 8, wherein:

the at least one burst bit includes a plurality of burst bits, and the burst bit counter receives the plurality of burst bits, and increases or decreases the plurality of burst bits sequentially from the least significant bit.

10. The burst address generator as claimed in claim 9, wherein:

the X burst address includes at least one X constant bit and at least one X variable bit, and the first selector generates the X constant bit from the X address and the X variable bit from the X burst bit so as to generate the X burst address.

11. The burst address generator as claimed in claim 10, wherein:

the Y burst address includes at least one Y constant bit and at least one Y variable bit, and the second selector generates the Y constant bit from the Y address and the Y variable bit from the Y burst bit so as to generate the Y burst address.

12. The burst address generator as claimed in claim 11, wherein the controller includes:

an algorithm pattern generator configured to generate the X address and the Y address; and a burst bit generator configured to determine the at least one burst bit of the X address and the Y address.

13. The burst address generator as claimed in claim 12, wherein the burst bit generator determines the at least one burst bit according to information received from an input unit.

14. The burst address generator as claimed in claim 13, wherein the burst address generator operates in synchronization with a rising edge of a reference clock.

15. The burst address generator as claimed in claim 13, wherein the burst address generator operates in synchronization with a rising edge and a falling edge of a reference clock.

16. A test apparatus, comprising:

a burst address generator, the burst address generator including:

a controller configured to determine an X address, a Y address, at least one burst bit of the X address and Y address;

a burst bit counter for receiving the at least one burst bit, and increasing or decreasing the at least one burst bit;

a burst bit splitter for receiving the increased or decreased at least one burst bit from the burst bit counter, and dividing the increased or decreased at least one burst bit into an X burst bit and a Y burst bit;

a first selector for receiving the X address and the X burst bit, and generating an X burst address; and a second selector for receiving a Y address and a Y burst bit, and generating a Y burst address.

17. The test apparatus as claimed in claim 16, wherein:

the at least one burst bit includes a plurality of burst bits, and the burst bit counter receives the plurality of burst bits, and increases or decreases the plurality of burst bits sequentially from the least significant bit.

18. The test apparatus as claimed in claim 17, further comprising a test head that includes a probe pin connectable to a device under test, and a comparator, wherein:

the device under test receives the X burst address and the Y burst address through the probe pin, and outputs data stored in the X burst address and the Y burst address, and the comparator generates a comparison result by comparing the data output from the device under test and expected data.

19. The test apparatus as claimed in claim 18, further comprising a failure capture memory, wherein the failure capture memory receives the X burst address and the Y burst address, and stores the comparison result in the X burst address and the Y burst address.

20. The test apparatus as claimed in claim 18, wherein the expected data is data stored in the X burst address and the Y burst address of a good memory.

* * * * *